(12) United States Patent
Kim

(10) Patent No.: US 7,948,328 B2
(45) Date of Patent: May 24, 2011

(54) OSCILLATOR GENERATING NORMAL CLOCK SIGNAL

(75) Inventor: Bo-Geun Kim, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 259 days.

(21) Appl. No.: 12/238,712

(22) Filed: Sep. 26, 2008

(65) Prior Publication Data

US 2009/0085680 A1    Apr. 2, 2009

(30) Foreign Application Priority Data

Oct. 2, 2007  (KR) .......................... 10-2007-0099415

(51) Int. Cl.
*H03K 3/26*    (2006.01)
(52) U.S. Cl. .......... 331/111; 331/143; 331/16; 331/175; 331/183

(58) Field of Classification Search .................. 331/111, 331/143, 16, 175, 183
See application file for complete search history.

(56) References Cited

FOREIGN PATENT DOCUMENTS

| KR | 1020050067567 A | 7/2005 |
|----|-----------------|--------|
| KR | 1020060044240 A | 5/2006 |
| KR | 1020060059283 A | 6/2006 |
| KR | 1020070067486 A | 6/2007 |

*Primary Examiner* — Arnold Kinkead
(74) *Attorney, Agent, or Firm* — Volentine & Whitt, PLLC

(57) ABSTRACT

Disclosed is an oscillator including a reference voltage generator generating a reference voltage, and a logic combination circuit generating complementary first and second internal clock signals in response to the reference voltage and complementary first and second output voltages. One of the first and second output voltages—the one going high—is provided to the logic combination circuit before the other one of the first and second output voltages—the one going low.

10 Claims, 4 Drawing Sheets

OSCILLATOR GENERATING NORMAL CLOCK SIGNAL

CROSS-REFERENCE TO RELATED APPLICATIONS

This U.S. non-provisional patent application claims priority under 35 U.S.C. §119 to Korean Patent Application No. 10-2007-0099415 filed on Oct. 2, 2007, the subject matter of which is hereby incorporated by reference.

BACKGROUND

The present invention relates generally to oscillators and more particularly to an oscillator generating a stable clock signal.

Oscillators are commonly incorporated within various semiconductor devices (e.g., semiconductor memories and/or control logic devices) to generate periodic signals, such as clock signals. Clock signals, a generic term applied to a broad class of reference timing signals, are applied to pump circuits, timing circuits, data latches, etc.

Oscillators generate one or more clock signals in accordance relation to a voltage comparison. For example, a working voltage (or a so-called internal voltage) developed by the charging or discharging of a capacitor may be compared to an externally provided reference voltage. Thus, the amplitude and/or cyclical characteristics of a clock signal will be affected by any variation in a power source voltage applied to the oscillator.

Assuming in one example that a conventional oscillator includes a comparator (e.g., a differential amplifier) comparing an internal voltage with a reference voltage, such a comparator may be activated in response to an enable signal. That is, the comparator begins a voltage comparison operation upon detecting a low-to-high transition in the applied enable signal. However, the rise time of the enable signal transition may become skewed (i.e., may be extended) due to a lower than specified power source voltage. If the low-to-high transition extends into the output timing of the comparator, it may cause difficulty in generating a "normal clock signal" (i.e., a clock signal meeting a defined specification for amplitude, period, and/or phase, etc.).

FIG. 1 is a circuit diagram showing a comparator adapted for use within a conventional oscillator. As shown in FIG. 1, comparator 10 includes PMOS transistors MP1, MP2, and MP3, and NMOS transistors MN1, MN2, and MN3. When the level of power source voltage Vcc falls below a defined operating threshold, comparator 10 may operate in response to an extended low-to-high transition for the first enable signal En and its logical complement second enable signal EnB.

The PMOS and NMOS transistors, MP1 and MN1, activate comparator 10 in response to first and second enable signals EnB and En, respectively. The activated comparator 10 then operates to compare first and second voltages $V_1$ and $V_2$, which are provided respectively through the NMOS transistors MN2 and MN3. The result of the comparison is provided at output terminal Out.

If the first voltage $V_1$ is higher than the second voltage $V_2$, comparator 10 outputs a logically "high" output signal. However, if the first voltage $V_1$ is lower than the second voltage $V_2$, comparator 10 outputs a logically "low" output signal. The output of comparator 10 is determined in large part by the current driving characteristics of the PMOS transistor MP3. However, the current "drivability" of the PMOS transistor MP3 varies with the voltage potential at node "a". When node "a" is at ground, the source of the NMOS transistor MN2 is connected to ground through the NMOS transistor MN1, there is no drain-source potential difference between the NMOS transistor MN2, and no current flows through the NMOS transistor MN2. Hence, node "a" does not stay at ground, but is set to a voltage level that turns ON the PMOS transistors MP2 and MP3.

In the illustrated example of FIG. 1, it is assumed that the output terminal Out is initially at a low level when comparator 10 is not activated. When comparator 10 is activated and the first voltage V1 is higher than the second voltage V2, the output of comparator 10 transitions from low to high. Thus, the current drivability of PMOS transistor MP3 is reduced. The reduced current drivability of PMOS transistor MP3 has the effect of extending a low-to-high transition time for the output of comparator 10.

SUMMARY OF THE INVENTION

The present invention is directed to an oscillator capable of generating a normal clock signal even when an applied power source voltage is reduced in level.

In one embodiment, the invention provides an oscillator comprising; a reference voltage generator generating a reference voltage, and a logic combination circuit generating complementary first and second internal clock signals in response to the reference voltage and in response to applied complementary first and second output voltages, wherein one of the first and second output voltages going high is provided to the logic combination circuit before the other one of the first and second output voltages going low.

In another embodiment, the invention provides an oscillator comprising; a reference voltage generator generating a reference voltage, a first output voltage generator generating a first output voltage going high or low in response to the reference voltage and a second internal clock signal, a second output voltage generator generating a second output voltage complementary to the first input signal in response to the reference voltage and a first internal clock signal complementary to the second internal clock signal, and a logic combination circuit logically combining the first and second output voltages to generate the first and second internal clock signals, wherein one of the first and second output voltages going high is provided to the logic combination circuit before the other one of the first and second output voltages going low.

In a related embodiment, the first voltage output generator may comprise; a first voltage generator generating a first applied voltage in response to the second internal clock signal, a first comparator comparing the first applied voltage with the reference voltage to generate the first output voltage, and a first pull-up circuit pulling up an output of the first comparator in response to the second internal clock signal to generate the first output voltage.

In another related embodiment, the second voltage output generator may comprise; a second voltage generator generating a second applied voltage in response to the first internal clock signal, a second comparator comparing the second applied voltage with the reference voltage to generate the second output voltage, and a second pull-up circuit pulling up an output of the second comparator in response to the first internal clock signal to generate the second output voltage, wherein one of the first and second output voltages going high is pulled up by a corresponding one of the first and second pull-up circuits before being applied to the logic combination circuit before the other one of the first and second output voltages going low.

DESCRIPTION OF EMBODIMENTS

Figure 1:
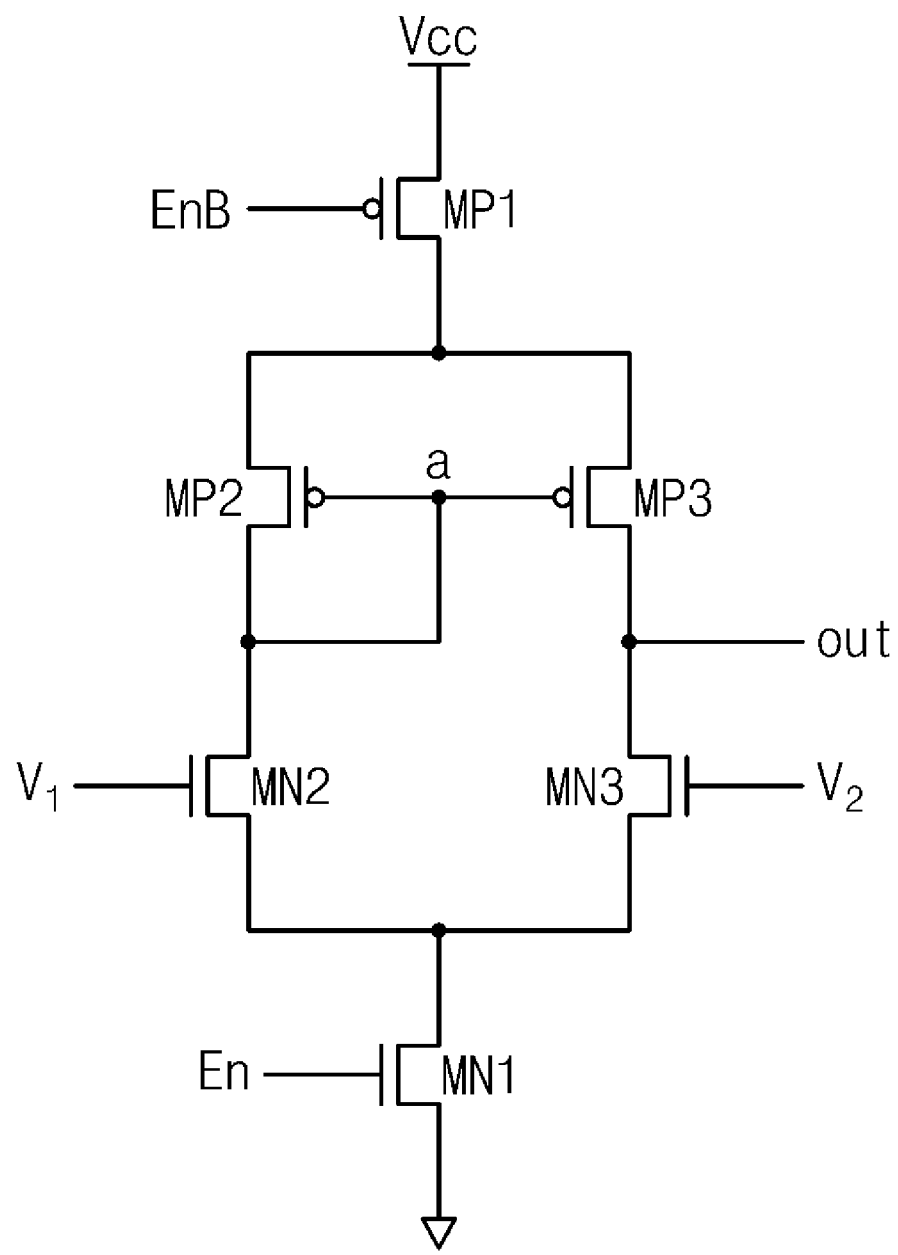
FIG. 1 is a circuit diagram illustrating a comparator adapted for use in a conventional oscillator.

Embodiments of the invention will now be described in some additional detail with reference to the accompanying drawings. The present invention may, however, be embodied in different forms and should not be constructed as being limited to only the illustrated embodiments. Rather, these embodiments are presented as teaching examples. Throughout the written description and drawings, like reference numerals refer to like or similar elements.

Figure 2:
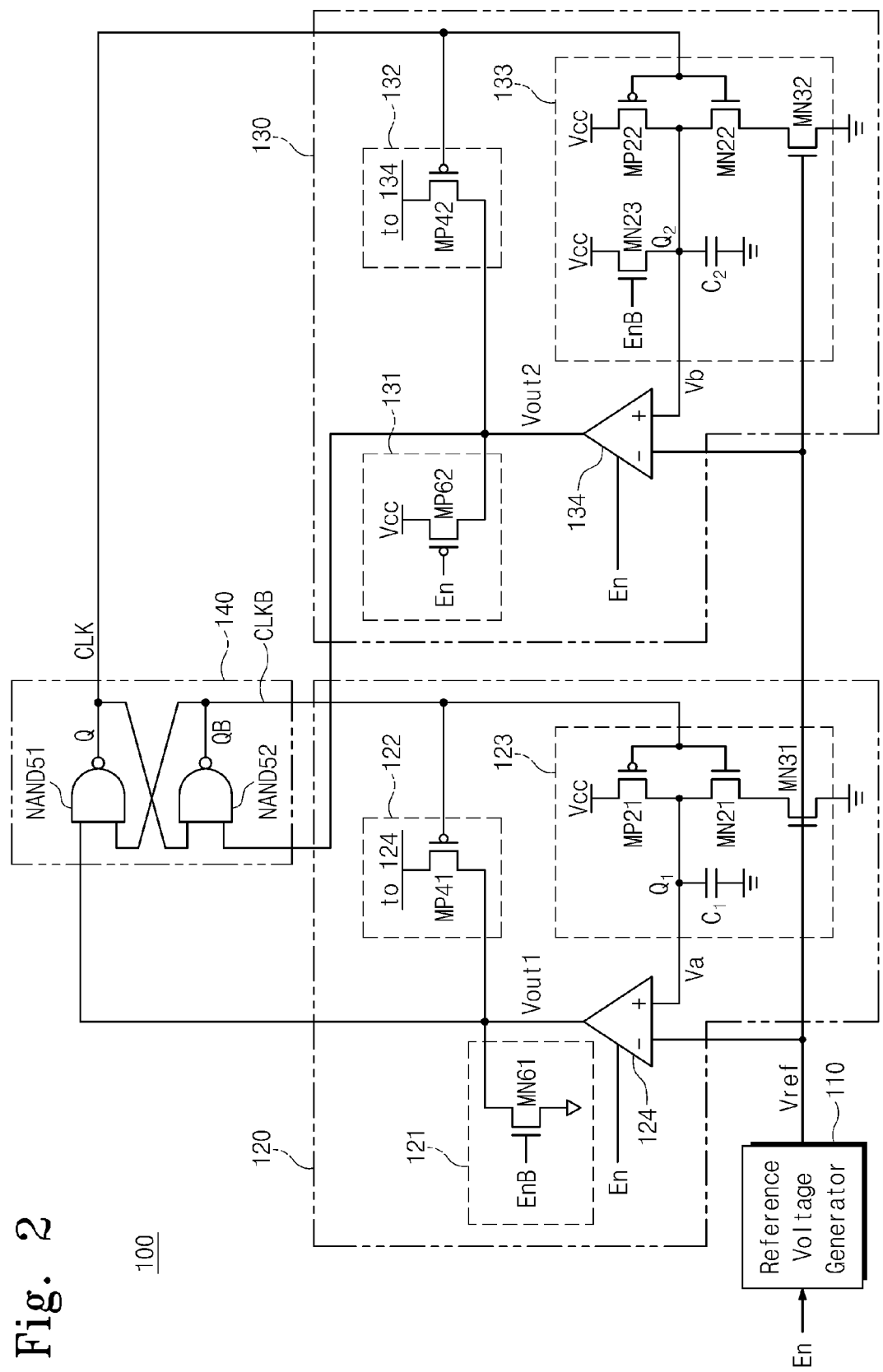
FIG. 2 is a circuit diagram illustrating an oscillator in accordance with an embodiment of the invention.

FIG. 2 is a circuit diagram illustrating an oscillator according to an embodiment of the invention. Referring to FIG. 2, an oscillator 100 generally comprises a reference voltage generator 110, a first output voltage generator 120, a second output voltage generator 130, and a logic combination circuit 140.

Reference voltage generator 110 operates to generate a reference voltage Vref and also provides the reference voltage Vref to the first and second output voltage generators 120 and 130. First output voltage generator 120 operates to generate a first output voltage (Vout1) which transitions from high level to low level ("goes low") or from low level to high level ("goes high") in response to the reference voltage Vref and a second internal clock signal (CLKB) generated by logic combination circuit 140. The second output voltage generator 130 operates to generate a second output voltage (Vout2) which goes low or high in response to the reference voltage Vref and a first internal clock signal generated by logic combination circuit 140. One of the first and second output voltages signals—the one going high—is provided to logic combination circuit 140 before the other one of the first and second output voltages—the one going low.

Logic combination circuit 140 respectively receives the first and second output voltages from first and second output voltage generators 120 and 130 and logically combines the first and second output voltages. The first and second output signals generated in accordance with this logical combination act as first and second internal clock signals. That is, the first and second output signals provided by logic combination circuit 140 are, in effect, clock signals transitioning in a complementary relationship to one another.

First output voltage generator 120 in the illustrated embodiment comprises a first initializing circuit 121, a first pull-up circuit 122, a first voltage generator 123, and a first comparator 124. Second output voltage generator 130 in the illustrated embodiment comprises a second initializing circuit 131, a second pull-up circuit 132, a second voltage generator 133, and a second comparator 134.

As further illustrated in FIG. 2, first initializing circuit 121 comprises an NMOS transistor MN61; first pull-up circuit 122 comprises a PMOS transistor MP41; and, first voltage generator 123 comprises a first capacitor $C_1$, a PMOS transistor MP21, and NMOS transistors MN21 and MN31.

Second initializing circuit 131 comprises a PMOS transistor MP62; second pull-up circuit 132 comprises a PMOS transistor MP42; and, second voltage generator 133 comprises a second capacitor $C_2$, a PMOS transistor MP22, and NMOS transistors MN22, MN23, and MN32.

Logic combination circuit 140 comprises NAND gates NAND51 and NAND52, and may be formed in one embodiment as a set-rest (SR) latch.

The output of first comparator 124 is connected to the drain of NMOS transistor MN61, the drain of PMOS transistor MP41, and a first input of NAND gate NAND51. The gate of NMOS transistor MN61 is coupled to the second enable signal EnB. The source of NMOS transistor MN61 is connected to ground GND. The source of PMOS transistor MP41 is connected to the output of first comparator 124. (See, also FIG. 3). The gate of PMOS transistor MP41 is connected to the output of NAND gate NAND52, and the gates of PMOS and NMOS transistors MP21 and MN21. The source of PMOS transistor MP21 is connected to the power source voltage Vcc. The drain of PMOS transistor MP21 is connected to the drain of NMOS transistor MN21, one electrode of first capacitor $C_1$, and a non-inverted input (+) of first comparator 124 through a first output voltage node $Q_1$. The other electrode of first capacitor $C_1$ is connected to ground. The source of NMOS transistor MN21 is connected to the drain of NMOS transistor MN31. The gate of the NMOS transistor MN31 is coupled to the reference voltage Vref. The source of NMOS transistor MN31 is connected to ground. The inverted input (−) of first comparator 124 is coupled to the reference voltage Vref provided from reference voltage generator 110.

The output of second comparator 134 is connected to the drain of NMOS transistor MN62, the drain of PMOS transistor MP42, and a first input of NAND gate NAND52. The gate of NMOS transistor MN62 is coupled to the first enable signal En. The source of NMOS transistor MN62 is connected to the power source voltage Vcc. The source of PMOS transistor MP42 is connected to the output of second comparator 134. (Here again, see FIG. 3).

The gate of PMOS transistor MP42 is connected to the output of NAND gate NAND5 as well as the gates of PMOS and NMOS transistors MP22 and MN22. The source of PMOS transistor MP22 is connected to the power source voltage Vcc. The drain of PMOS transistor MP22 is connected to the drain of NMOS transistor MN22, one electrode of second capacitor $C_2$, and the non-inverted input (+) of second comparator 134 through a second voltage output node $Q_2$. The other electrode of second capacitor $C_2$ is connected to ground. The source of NMOS transistor MN22 is connected to the drain of NMOS transistor MN32. The gate of NMOS transistor MN32 is coupled to the reference voltage Vref. The source of NMOS transistor MN32 is connected to ground. The inverted input (−) of second comparator 134 is coupled to the reference voltage Vref provided by reference voltage generator 110. The source of NMOS transistor MN32 is connected to one electrode of the second capacitor $C_2$. The gate of NMOS transistor MN32 is coupled to the second enable signal EnB. The drain of NMOS transistor MN32 is connected to the power source voltage Vcc.

The first output voltage Vout1 generated by first comparator 124 is the first input signal and the second output voltage Vout2 generated by second comparator 134 is the second input signal.

The output of NAND gate NAND51 is connected to the first input of NAND gate NAND52. The output of NAND gate NAND52 is connected to the second input of NAND gate NAND5. A first internal clock signal CLK is generated at the output of NAND gate NAND51. The first internal clock signal CLK corresponds to a first logic output "Q" of logic combination circuit 140, whereas the output of NAND gate NAND52, a second internal clock signal CLKB, corresponds to a second logic output "QB" of logic combination circuit 140. Thus, the first internal clock signal is provided at the first logic output "Q" of logic combination circuit 140, while the second internal clock signal is provided at the second logic output "QB".

Figure 3:
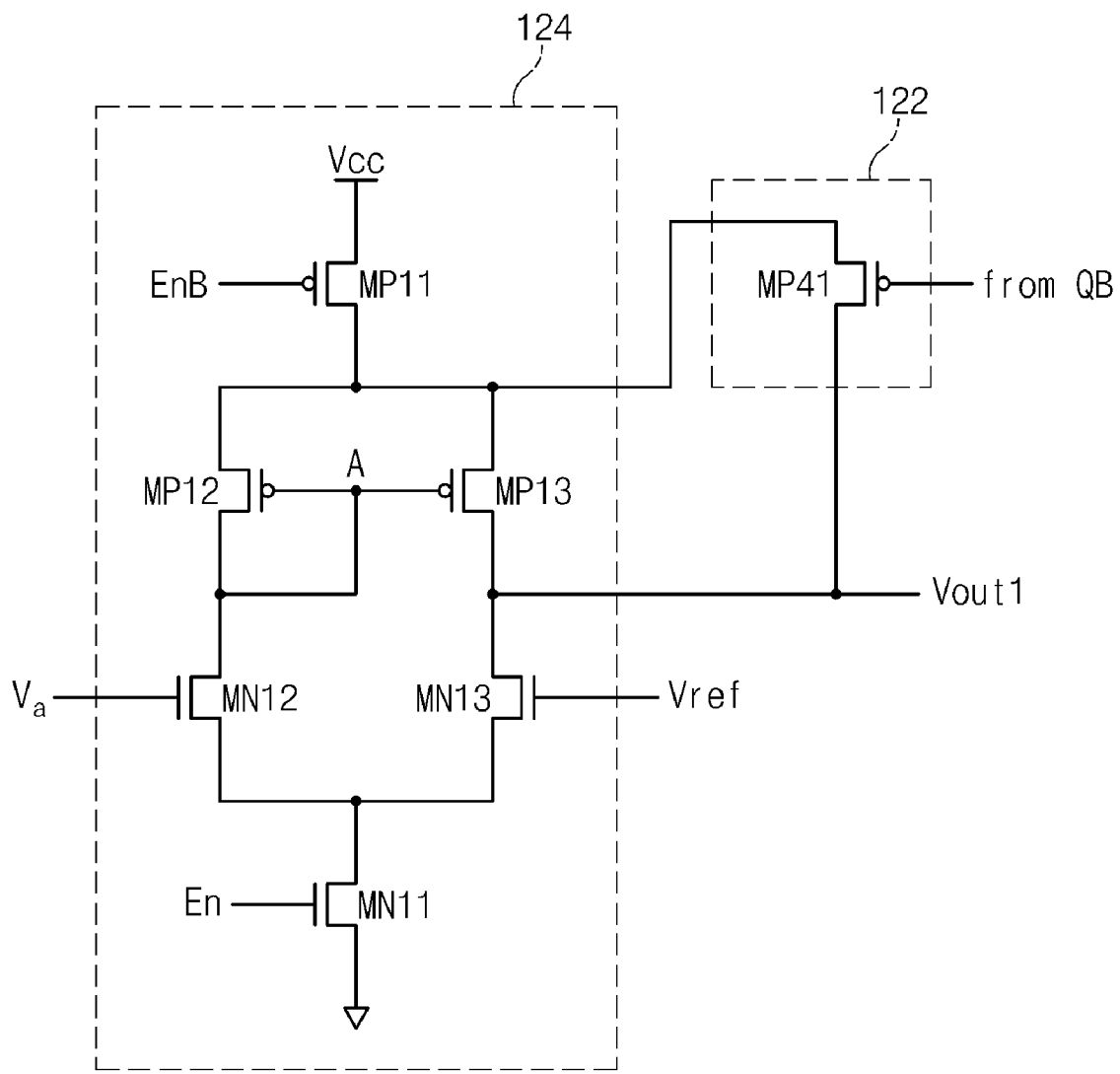
FIG. 3 is a circuit diagram further illustrating the comparator circuit of FIG. 1.

FIG. 3 is a circuit diagram further illustrating the comparator shown in FIG. 1. In the exemplary embodiment of FIG. 3, the interconnection between the pull-up circuit and the comparator of FIG. 2 is illustrated in some additional detail. A similar interconnection structure may exist between the first pull-up circuit and comparator 122 and 124, and between the first pull-up circuit and comparator 132 and 134, respectively.

Referring to FIG. 3, first comparator 124 comprises PMOS transistors MP11, MP12, and MP13, and NMOS transistors MP11, MP12, and MP13. The source of PMOS transistor MP11 is connected to the power source voltage Vcc. The gate of PMOS transistor MP11 is coupled to the second enable signal EnB. The sources of PMOS transistors MP12 and MP13 are connected to the drain of PMOS transistor MP11. The gates of PMOS transistors MP12 and MP12 are connected to the drain of NMOS transistor MN12. The drain of PMOS transistor MP13 is connected to the output of first comparator 124 and the drain of NMOS transistor MN13. The gate of NMOS transistor MN12 corresponds to the non-inverted input (+) of first comparator 124 and is responsive to a first applied voltage "Va". The gate of NMOS transistor MN13 corresponds to the inverted input (−) of first comparator 124 and is responsive to the reference voltage Vref. The sources of NMOS transistors MN12 and MN13 are connected to the drain of NMOS transistor MN11. The gate of NMOS transistor MN11 is coupled to the second enable signal EnB. The source of NMOS transistor MN11 is connected to ground. The source of PMOS transistor MP41 within first pull-up circuit 122 is connected to the source of PMOS transistor MP13 within first comparator 124.

Figure 4:
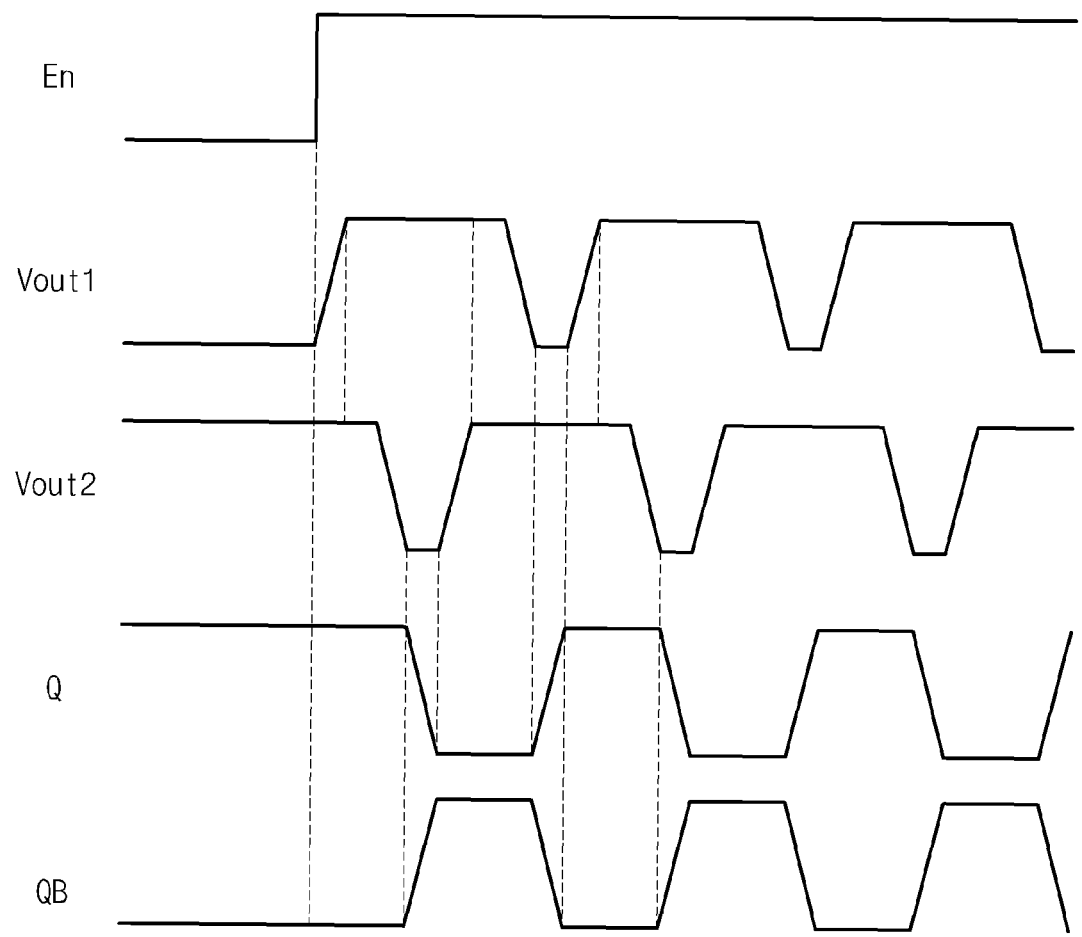
FIG. 4 is a waveform diagram illustrating various voltages and signals related to the oscillator of FIG. 1.

FIG. 4 is a waveform diagram illustrating voltages and signals associated with the oscillator of FIG. 2. Referring to FIGS. 2 through 4, the operation of oscillator 100 will be described in some additional detail.

An assumed initialization operation for oscillator 100 will first be described. Thus, oscillator 100 is assumed to be in a non-active operating state.

Oscillator 100 is disabled when the first enable signal En is not active (e.g., is low). Hence, the second enable signal EnB turns ON NMOS transistor MN61 of first initializing circuit 121. With this conductive state established, the first output voltage Vout1 of first comparator 124 is low. That is, the first enable signal En turns ON PMOS transistor MN62 of second initializing circuit 131 to set the second output voltage Vout2 of second comparator 134 to high. Thus, as shown in FIG. 4, the first output voltage Vout1 of first comparator 124 is initialized at low and the second output voltage Vout2 of second comparator 134 is initialized at high.

The first input of NAND gate NAND51 receives the low first output voltage Vout1 from first comparator 124. The NAND gate NAND51 outputs a high regardless of a signal level applied to the second input of the NAND gate NAND51. The high signal from NAND gate NAND51 is provided to the first input of NAND gate NAND52. The second input of NAND gate NAND52 receives the high second output voltage Vout2 from second comparator 134. As NAND gate NAND52 receives high signals through its first and second inputs, it outputs a low. As shown in FIG. 4 and as provided by logic combination circuit 140, the first logic output Q is initialized high while the second logic output QB is initialized low.

The high signal provided at the first logic output Q turns ON PMOS transistor MP42 of second pull-up circuit 132.

The low signal provided at the second logic output QB turns ON PMOS transistor MP41 of first pull-up circuit 131.

The first and second comparators 124 and 134 are not active when the first enable signal En is inactive. As can be seen from FIG. 2, the PMOS and NMOS transistors MP11 and MN11 are turned OFF when the first enable signal En is inactive. While PMOS transistor MP41 of second pull-up circuit 122 is conductive, there is no supply of the power source voltage Vcc because PMOS transistor MP11 is turned OFF.

Thus, an inactive state for the first enable signal En interrupts the output of the reference voltage Vref from reference voltage generator 110. Thus, NMOS transistors MN31 and MN32 are turned OFF when the first enable signal En is inactive.

The low second logic output QB turns ON the PMOS and NMOS transistors MP21 and MN21 of first voltage generator 123. Then, the first voltage node $Q_1$ is initialized as high. The high first logic output Q turns OFF PMOS transistor MP22 of second voltage generator 133, and turns ON the NMOS transistor MN22. As NMOS transistor MN22 is turned ON while NMOS transistor MN32 is turned OFF, there is no current flow to ground.

NMOS transistor MN32 is turned ON in response to the second enable signal EnB. Thus, the second voltage node $Q_2$ is initialized at high.

Hereinafter the description of the operation of oscillator 100 will continue under the assumption that the circuit is in an active mode responsive to the first enable signal En.

An active (or high) first enable signal En turns OFF transistors MN61 and MP62 of first and second initializing circuits 121 and 131 and NMOS transistor MN23 of second voltage generator 133. Reference voltage generator 110, as activated by the first enable signal En generates the reference voltage Vref. The reference voltage Vref is provided to the inverted inputs of first and second comparators 124 and 134, and the gates of NMOS transistors MN31 and MN32. NMOS transistors MN31 and MN32 are turned ON to form current paths to ground. Thus, the first enable signal En activates the first and second comparators 124 and 134.

In this active mode of operation, the high first logic output Q of logic combination circuit 140 turns OFF PMOS transistor MP22 of second voltage generator 133, but turns ON NMOS transistor MN22. The second voltage node $Q_2$ has been initialized at high, and the low second logic output QB of logic combination circuit 140 turns ON PMOS transistor MP21 of second voltage generator 133, but turns Off NMOS transistor MN21. Hence, the first voltage node $Q_1$ has been initialized at high.

The first capacitor $C_1$ is charged when PMOS transistor MP21 is turned ON during the active mode of oscillator 100. The second capacitor $C_2$ is discharged when NMOS transistor MN22 is turned ON. This charge of the second capacitor $C_1$ causes the first voltage node $Q_1$ to increase in potential. As the first voltage node $Q_1$ increases in potential, the first applied voltage Va rises. If the first applied voltage Va rises above the reference voltage Vref, first comparator 124 causes the first output voltage Vout1 to go high, as a result of the comparison between the first applied voltage Va with the reference voltage Vref.

According to the discharge of the second capacitor $C_2$, the voltage potential of the second output node $Q_2$ decreases. As the potential of the second voltage node $Q_2$ falls, a second applied voltage Vb also falls. If the second applied voltage Vb fall below the reference voltage Vref, second comparator 134 causes that first output voltage Vout1 to go low, as a result of the comparison between the applied first voltage Va and the reference voltage Vref.

PMOS transistor MP41 of first pull-up circuit 122 is turned ON by the initial low of the second logic output QB of logic combination circuit 140. PMOS transistor MP42 of second pull-up circuit 132 is turned OFF by the initial high of the first logic output Q of logic combination circuit 140.

Referring now to FIG. 3, the source of PMOS transistor MP41 of first pull-up circuit 122 receives the power source voltage Vcc through the turned-ON PMOS transistor MP11. Therefore, PMOS transistor MP41 of pull-up circuit 122 acts as a pull-up resistor. The low signal applied to the gate of PMOS transistor MP41 of first pull-up circuit 122 is leveled to near ground, being lower than the potential at comparison node "A" of first comparator 124 shown in FIG. 3. Thus, PMOS transistor MP41 of first pull-up circuit 122 is larger than PMOS transistor MP13 in gate-source potential difference. Under this condition, the output of first comparator 124 goes low through PMOS transistor MP41 of first pull-up circuit MP41 faster than through PMOS transistor MP13.

Even when the level of power source voltage Vcc falls below specification, PMOS transistor MP41 of first pull-up circuit 122 is larger than the PMOS transistor MP13 in its gate-source potential difference. Accordingly, the output of first comparator 124 rises to high by operation of PMOS transistor MP41 of first pull-up circuit 122 faster than by PMOS transistor MP13.

As a result, the level of the first output voltage Vout1 more rapidly goes high by means of turned-ON PMOS transistor MP41. Namely, the level of the first output voltage Vout1 is pulled up over a shorter period of time through turned-ON PMOS transistor MP41.

As illustrated in FIG. 4, the second output voltage Vout2 goes low after the first output voltage Vout1 goes high. In other words, the high first output voltage Vout1 is provided to logic combination circuit 140 before the low second output voltage Vout2.

The high first output voltage Vout1 is applied to the first input of NAND gate NAND51. As initialized, the second input of NAND gate NAND51 is low. Thus, the output of NAND gate NAND51 is high. As the output of NAND gate NAND51 is provided to the first input of NAND gate NAND52, the first input of NAND gate NAND52 is also high. As initialized, the second input of NAND gate NAND52 is high. As the first and second inputs of NAND gate NAND52 are high, it outputs a low. Thus, as shown in FIG. 4, the first logic output Q of logic combination circuit 140 goes high level while the second logic output QB goes low. Then, the first capacitor $C_1$ continues to be charged while the second capacitor $C_2$ is discharged.

Afterward, the second output voltage Vout2 of second comparator 134, which has transitioned to low, is provided to the second input of NAND gate NAND52. As the first and second inputs of NAND gate NAND52 are high and low levels respectively, its outputs a high. As the output of NAND gate NAND52 is connected to the second input of NAND gate NAND51, the second input of NAND gate NAND51 goes high. Referring to the aforementioned, the high first output signal Vout1 of first comparator 124 has been applied to the first input of NAND gate NAND51. Since high level signals are applied to the first and second inputs of NAND gate NAND51, it outputs a low. As the output of NAND gate NAND51 is low, the first input of NAND gate NAND52 goes low. As shown in FIG. 4, the first logic output Q of logic combination circuit 140 goes low while the second logic output QB goes high.

As the first logic output Q of logic combination circuit 140 is low, the second capacitor $C_2$ is discharged and PMOS transistor MP42 of second pull-up circuit 132 is turned ON. Meanwhile, as the second logic output QB of logic combination circuit 140 is high, the first capacitor $C_1$ is charged and PMOS transistor MP41 of first pull-up circuit 122 is turned OFF.

Consequently, as illustrated in FIG. 4, the first logic output Q of logic combination circuit 140 is generated by repeating highs and lows. Thus, oscillator 100 is able to generate a normal clock signal.

That is, if oscillator 100 is implemented without the first and second pull-up circuits 122 and 132 and the power source voltage Vcc supplied to first and second comparators 124 and 134 sags below a defined threshold, oscillator 100 will not be able to generate a normal clock signal. This outcome is described in some additional detail below.

Again, assuming the previous initial conditions, oscillator 100 is activated in response to an active first enable signal En. Referring to the comparator of FIG. 1, for example, as the gate-source voltage difference of PMOS transistor MP3 becomes smaller due to the reduced power source voltage, a low-to-high transition by the comparator becomes extended. Thus, first comparator 124 operates slower in its low-to-high transitions. In this case, an output result of high-to-low transition from second comparator 134 may be provided to logic combination circuit 140 earlier than the low-to-high transition output by second comparator 134. If the low second output voltage Vout2 is provided to logic combination circuit 140 from second comparator 134, the second input of NAND gate NAND52 of logic combination circuit 140 goes low.

As initialized, the first input of NAND gate NAND52 is high. As the first and second inputs of NAND gate NAND52 are high and low respectively, it outputs a high. The output of NAND gate NAND52 is applied to the second input of NAND gate NAND51, and the second input of NAND gate NAND51 goes high. As initialized, the first input of NAND gate NAND51 is low. As the first and second inputs of NAND gate NAND51 are low and high levels respectively, it outputs a high. As a result, the first and second logic outputs Q and QB of logic combination circuit 100 become high.

As the first and second logic outputs Q and QB of logic combination circuit 100 are high, the first and second capacitors $C_1$ and $C_2$ are both discharged. Since the first and second capacitors $C_1$ and $C_2$ are discharged, first and second comparators 124 and 134 generate the first and second output voltages Vout1 and Vout2 at low. The first output voltage Vout1 is applied to the first input of NAND gate NAND51, while the second output voltage Vout2 is applied to the second input of NAND gate NAND52. Thus, NAND gates NAND51 and NAND52 outputs highs. Since this operation is repeated continuously, it is impossible to generate a proper oscillating clock signal.

However, as shown in FIGS. 2 through 4, oscillator 100 comprises first and second pull-up circuits 122 and 123, and is free from the aforementioned problems. Referring to the aforementioned, in oscillator 100, the first output signal Vout1 of first comparator 124 goes high through PMOS transistor PM41 of first pull-up circuit 122, faster than through PMOS transistor MP13 of first comparator 124. Also, the second output signal Out2 of second comparator 134 goes high through PMOS transistor PM42 of second pull-up circuit 132, faster than through PMOS transistor MP13 of second comparator 134.

As described above, an oscillator according to an embodiment of the invention is able to generate a normal clock signal.

The above-disclosed subject matter is to be considered illustrative, and not restrictive, and the appended claims are intended to cover all such modifications, enhancements, and other embodiments, which fall within the scope of the invention. Thus, to the maximum extent allowed by law, the scope of the invention is to be determined by the broadest permissible interpretation of the following claims and their equivalents, and shall not be restricted or limited by the foregoing detailed description.

What is claimed is:

1. An oscillator comprising:
a reference voltage generator generating a reference voltage;
a first output voltage generator generating a first output voltage going high or low in response to the reference voltage and a second internal clock signal, wherein the first voltage output generator comprises:
a first voltage generator generating a first applied voltage in response to the second internal clock signal;
a first comparator comparing the first applied voltage with the reference voltage to generate the first output voltage;
a first pull-up circuit pulling up an output of the first comparator in response to the second internal clock signal to generate the first output voltage: and
a first initializing circuit initializing the output of the first comparator;
a second output voltage generator generating a second output voltage complementary to the first input signal in response to the reference voltage and a first internal clock signal complementary to the second internal clock signal, wherein the second voltage output generator comprises:
a second voltage generator generating a second applied voltage in response to the first internal clock signal;
a second comparator comparing the second applied voltage with the reference voltage to generate the second output voltage;
a second pull-up circuit pulling up an output of the second comparator in response to the first internal clock signal to generate the second output voltage, wherein one of the first and second output voltages going high is pulled up by a corresponding one of the first and second pull-up circuits before being applied to the logic combination circuit before the other one of the first and second output voltages going low; and
a second initializing circuit initializing the output of the second comparator; and
a logic combination circuit logically combining the first and second output voltages to generate the first and second internal clock signals,
wherein one of the first and second output voltages going high is provided to the logic combination circuit before the other one of the first and second output voltages going low,
the respective outputs of the first and second comparators are initialized at complementary logic levels by the first and second initializing circuits, and
the first and second pull-up circuits are configured to operate without an applied power supply voltage following initialization of the first and second comparators by the first and second initializing circuits.

2. An oscillator comprising:
a reference voltage generator generating a reference voltage;
a first output voltage generator generating a first output voltage going high or low in response to the reference voltage and a second internal clock signal, wherein the first voltage output generator comprises:
a first voltage generator generating a first applied voltage in response to the second internal clock signal;
a first comparator comparing the first applied voltage with the reference voltage to generate the first output voltage; and
a first pull-up circuit pulling up an output of the first comparator in response to the second internal clock signal to generate the first output voltage;
a second output voltage generator generating a second output voltage complementary to the first input signal in response to the reference voltage and a first internal clock signal complementary to the second internal clock signal, wherein the second voltage output generator comprises:
a second voltage generator generating a second applied voltage in response to the first internal clock signal;
a second comparator comparing the second applied voltage with the reference voltage to generate the second output voltage; and
a second pull-up circuit pulling up an output of the second comparator in response to the first internal clock signal to generate the second output voltage, wherein one of the first and second output voltages going high is pulled up by a corresponding one of the first and second pull-up circuits before being applied to the logic combination circuit before the other one of the first and second output voltages going low; and
a logic combination circuit logically combining the first and second output voltages to generate the first and second internal clock signals,
wherein one of the first and second output voltages going high is provided to the logic combination circuit before the other one of the first and second output voltages going low, and the first and second voltage generators respectively initialize the first and second applied voltages at high.

3. The oscillator of claim 1, wherein the first and second pull-up circuits alternately pull up the outputs of the first and second comparators in response to the first and second internal clock signals.

4. The oscillator of claim 1, wherein the first and second voltage generators alternately control charging and discharging operations in response to the first and second internal clock signals.

5. The oscillator of claim 4, wherein the first and second voltage generators generate the first and second applied voltages using the charging and discharging operations.

6. The oscillator of claim 5, wherein the output of the first and second comparators generated by comparing the reference voltage with either the first applied voltage or the second applied voltage defined by the charging operation, goes high and is pulled up by a corresponding one of the first and second pull-up circuit.

7. The oscillator of claim 5, wherein an output of the first and second comparators generated by comparing the reference voltage with either the first applied voltage or the second applied voltage defined by the discharging operation, goes low and is interrupted by a corresponding one of the first and second pull-up circuit.

8. An oscillator comprising:
a reference voltage generator generating a reference voltage;
a first output voltage generator generating a first output voltage going high or low in response to the reference voltage and a second internal clock signal, wherein the first voltage output generator comprises:
  a first voltage generator generating a first applied voltage in response to the second internal clock signal;
  a first comparator comparing the first applied voltage with the reference voltage to generate the first output voltage;
  a first pull-up circuit pulling up an output of the first comparator in response to the second internal clock signal to generate the first output voltage; and
  a first initializing circuit initializing the output of the first comparator;
a second output voltage generator generating a second output voltage complementary to the first input signal in response to the reference voltage and a first internal clock signal complementary to the second internal clock signal, wherein the second voltage output generator comprises:
  a second voltage generator generating a second applied voltage in response to the first internal clock signal;
  a second comparator comparing the second applied voltage with the reference voltage to generate the second output voltage;
  a second pull-up circuit pulling up an output of the second comparator in response to the first internal clock signal to generate the second output voltage, wherein one of the first and second output voltages going high is pulled up by a corresponding one of the first and second pull-up circuits before being applied to the logic combination circuit before the other one of the first and second output voltages going low; and
  a second initializing circuit initializing the output of the second comparator; and
a logic combination circuit logically combining the first and second output voltages to generate the first and second internal clock signals,
wherein one of the first and second output voltages going high is provided to the logic combination circuit before the other one of the first and second output voltages going low, and
the first initializing circuit comprises an NMOS transistor and the second initializing circuit comprises a PMOS transistor.

9. An oscillator comprising:
a reference voltage generator generating a reference voltage;
a first output voltage generator generating a first output voltage going high or low in response to the reference voltage and a second internal clock signal, wherein the first voltage output generator comprises:
  a first voltage generator generating a first applied voltage in response to the second internal clock signal;
  a first comparator comparing the first applied voltage with the reference voltage to generate the first output voltage; and
  a first pull-up circuit pulling up an output of the first comparator in response to the second internal clock signal to generate the first output voltage;
a second output voltage generator generating a second output voltage complementary to the first input signal in response to the reference voltage and a first internal clock signal complementary to the second internal clock signal; and
a logic combination circuit logically combining the first and second output voltages to generate the first and second internal clock signals,
wherein one of the first and second output voltages going high is provided to the logic combination circuit before the other one of the first and second output voltages going low, and the first and second pull-up circuits comprise PMOS transistors.

10. The oscillator of claim 1, wherein the logic combination circuit is implemented as a set-reset (SR) latch.

* * * * *